United States Patent
Williams

(10) Patent No.: US 9,478,652 B1
(45) Date of Patent: Oct. 25, 2016

(54) MONOLITHIC INTEGRATED CIRCUIT (MMIC) STRUCTURE HAVING COMPOSITE ETCH STOP LAYER AND METHOD FOR FORMING SUCH STRUCTURE

(71) Applicant: Raytheon Company, Waltham, MA (US)

(72) Inventor: Adrian D. Williams, Methuen, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/683,812

(22) Filed: Apr. 10, 2015

(51) Int. Cl.
| | | |
|---|---|---|
| *H01L 21/02* | (2006.01) | |
| *H01L 29/778* | (2006.01) | |
| *H01L 29/66* | (2006.01) | |
| *H01L 29/47* | (2006.01) | |
| *H01L 21/768* | (2006.01) | |
| *H01L 21/311* | (2006.01) | |
| *H01L 23/31* | (2006.01) | |
| *H01L 29/205* | (2006.01) | |
| *H01L 23/66* | (2006.01) | |

(52) U.S. Cl.
CPC ....... *H01L 29/7787* (2013.01); *H01L 21/0217* (2013.01); *H01L 21/02274* (2013.01); *H01L 21/31116* (2013.01); *H01L 21/76805* (2013.01); *H01L 21/76829* (2013.01); *H01L 21/76895* (2013.01); *H01L 23/3171* (2013.01); *H01L 23/66* (2013.01); *H01L 29/205* (2013.01); *H01L 29/475* (2013.01); *H01L 29/66439* (2013.01); *H01L 2223/6672* (2013.01); *H01L 2223/6683* (2013.01)

(58) Field of Classification Search
USPC ........................................................ 257/190
See application file for complete search history.

(56) References Cited

U.S. PATENT DOCUMENTS

| | | |
|---|---|---|
| 9,082,722 B2 | 7/2015 | Williams et al. |
| 2001/0012652 A1 | 8/2001 | Matsuda |

(Continued)

OTHER PUBLICATIONS

Notification of Transmittal of the International Search Report and The Written Opinion of the International Searching Authority, or the Declaration, PCT/US2014/019860, Jun. 3, 2014, 1 page.

(Continued)

*Primary Examiner* — Timor Karimy
(74) *Attorney, Agent, or Firm* — Daly, Crowley, Mofford & Durkee, LLP

(57) ABSTRACT

A method for forming a semiconductor structure having a transistor device with a control electrode for controlling a flow of carriers between a first electrode and a second electrode. A passivation layer is deposited over the first electrode, the second electrode and the control electrode. An etch stop layer is deposited on the passivation layer over the control electrode. The etch stop layer includes the etch stop layer comprising: a first etch stop layer on the passivation layer, a buffer layer on the first etch stop layer, and a second etch stop layer on the buffer layer. A dielectric layer is formed over the etch stop layer. A window is etched through a selected region in the dielectric layer over the control electrode, to expose a portion of the etch stop layer disposed over the control electrode. A metal layer is formed on a portion of the etch stop layer and the dielectric layer is also formed on the metal layer. A second metal layer is deposited on the portion of the dielectric layer formed on the first mentioned metal layer.

2 Claims, 13 Drawing Sheets

(56) References Cited

U.S. PATENT DOCUMENTS

2008/0280400 A1    11/2008   Aihara
2014/0061659 A1    3/2014   Teplik et al.
2014/0284661 A1    9/2014   Williams et al.

OTHER PUBLICATIONS

International Search Report, PCT/US2014/019860, dated Jun. 3, 2014, 4 pages.
Written Opinion of the International Searching Authority, PCT/US2014/019860, dated Jun. 3, 2014, 6 pages.
Notification of Transmittal of the International Search Report and The Written Opinion of the International Searching Authority, or the Declaration, PCT/US2014/19860, Jun. 3, 2014, 1 page.
Notification of Transmittal of the International Search Report and The Written Opinion of the International Searching Authority, or the Declaration, PCT/US2016/026563, dated Jul. 18, 2016, 1 page.
International Search report, PCT/US2016/026563, dated Jul. 18, 2016, 5 pages.
Written Opinion of the International Searching Authority, PCT/US2016/026563, dated Jul. 18, 2016, 8 pages.

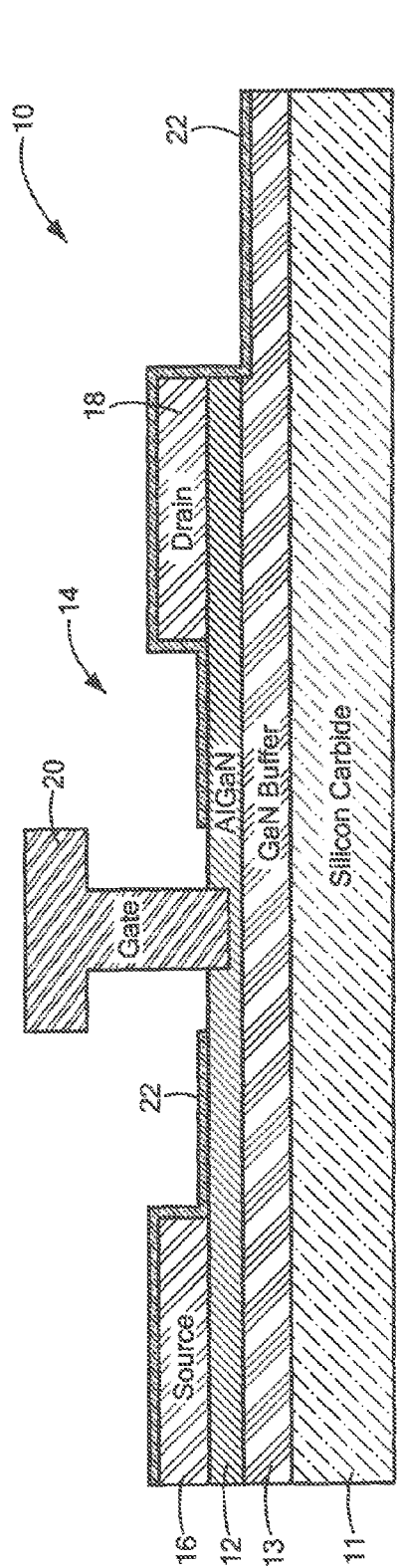
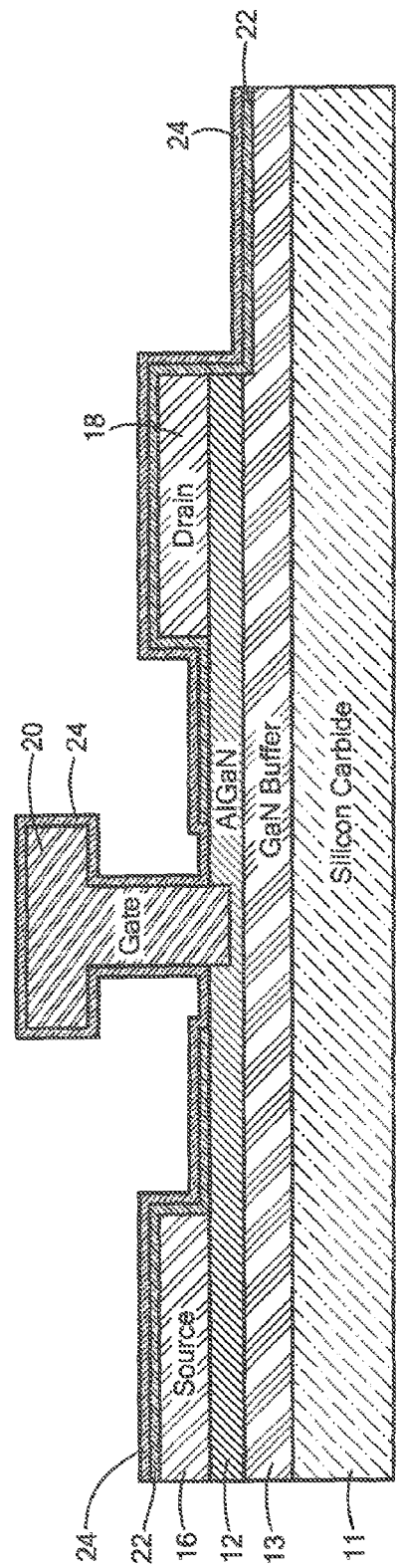
FIG. 1A
FIG. 1B

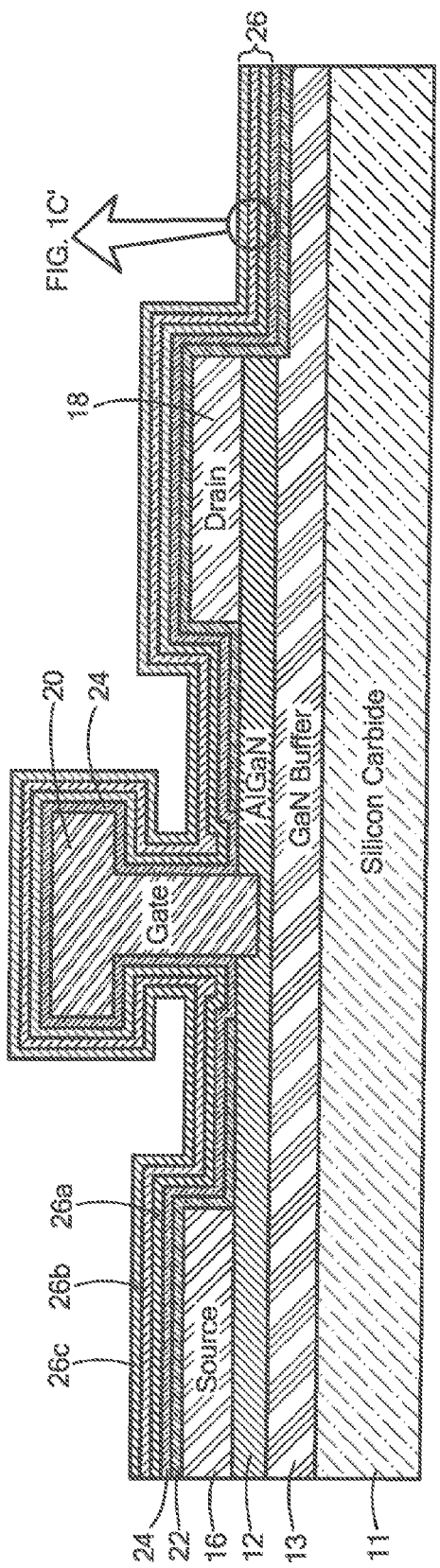
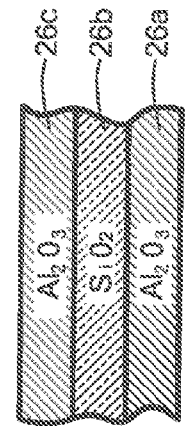
FIG. 1C
FIG. 1C'

MONOLITHIC INTEGRATED CIRCUIT (MMIC) STRUCTURE HAVING COMPOSITE ETCH STOP LAYER AND METHOD FOR FORMING SUCH STRUCTURE

TECHNICAL FIELD

This disclosure relates generally to a Monolithic Integrated Circuit (MMIC) Structure and to a method for selectively etching a dielectric layer using an underling etch stop layer to protect an underling active device passivation layer.

BACKGROUND AND SUMMARY

As is known in the art, as monolithic microwave integrated circuits (MMICs) are designed to operate at ever higher frequencies, the effects of dielectric loading on various MMIC conduction paths (including gates and transmission lines) becomes more pronounced. The minimization of such loading is critical to achieving the desired gain performance.

As is also known in the art, plasma enhanced chemical vapor deposition (PECVD) is widely used for the deposition of silicon nitride, which may act as a passivation layer to passivate components, or act as a capacitor dielectric. This deposition technique however, coats regions of the MMIC where the presence of additional dielectric is not desired and adversely impacts device performance at the higher frequencies.

As described in co-pending patent application Ser. No. 13/849,858, filed Mar. 25, 2013, published in U. S. Patent Application Publication 2014/0284661, published Sep. 25, 2014, assigned to the same assignee as the present patent application, a method was disclosed for forming a semiconductor structure, the entire subject matter thereof being incorporated herein by reference. The method included: providing a semiconductor layer with a transistor device having a control electrode for controlling a flow of carriers between a first electrode and a second electrode; depositing a passivation layer over the first electrode, the second electrode and the control electrode; depositing an etch stop layer on the passivation layer, such etch stop layer being disposed over the control electrode; forming a dielectric layer over the etch stop layer; and etching a window through a selected region in the dielectric layer over the control electrode, to expose a portion of the etch stop layer disposed over the control electrode.

In forming such structure it was discovered that chemicals used in the photolithographic processing effected the etch stop layer.

In accordance with this disclosure, the etch stop layer is formed as a composite structure, comprising: a first etch stop layer on the passivation layer, a buffer layer on the first etch stop layer, and a second etch stop layer on the buffer layer. With such an arrangement, chemicals used in the photolithographic processing while effecting the second etch stop layer are prevented from effecting the first etch stop layer by the buffer layer.

More particularly, it was found that the etch stop layer described in the above referenced U. S. Patent Application Publication 2014/0284661 was subject to attack from other commonly used process chemicals in standard MMIC fabrication such as ammonia and photoresist developer. Employing a buffer, such as, for example, a silicon dioxide interlayer, effectively creates a double-selective etch-stop layer that survives typical MMIC fabrication processing up to the point where etch-back is required. Post etch-back, it has been found that the residual etch stop material can be removed by timed exposure to ammonia since ammonia acts as a highly selective etchant to Atomic Layer Deposition (ALD) deposited aluminum oxide to PECVD nitride. This removal mitigates impact to RF performance of any residual dielectric associated with the etch-stop layer.

In one embodiment, the first etch stop layer is aluminum oxide.

In one embodiment the buffer layer is silicon dioxide;

In one embodiment, the second etch stop layer is aluminum oxide.

In one embodiment, the transistor device is a field effect transistor.

In one embodiment, the semiconductor layer is a III-V semiconductor material.

In one embodiment, the passivation layer is silicon nitride.

In one embodiment, the dielectric layer is silicon nitride.

In one embodiment, the dielectric layer is Plasma Enhanced Chemical Vapor Deposited (PECVD) silicon nitride In one embodiment, the first etch stop layer is an atomic layer deposited (ALD) layer.

In one embodiment, the second etch stop layer is an atomic layer deposited (ALD) layer.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1D:
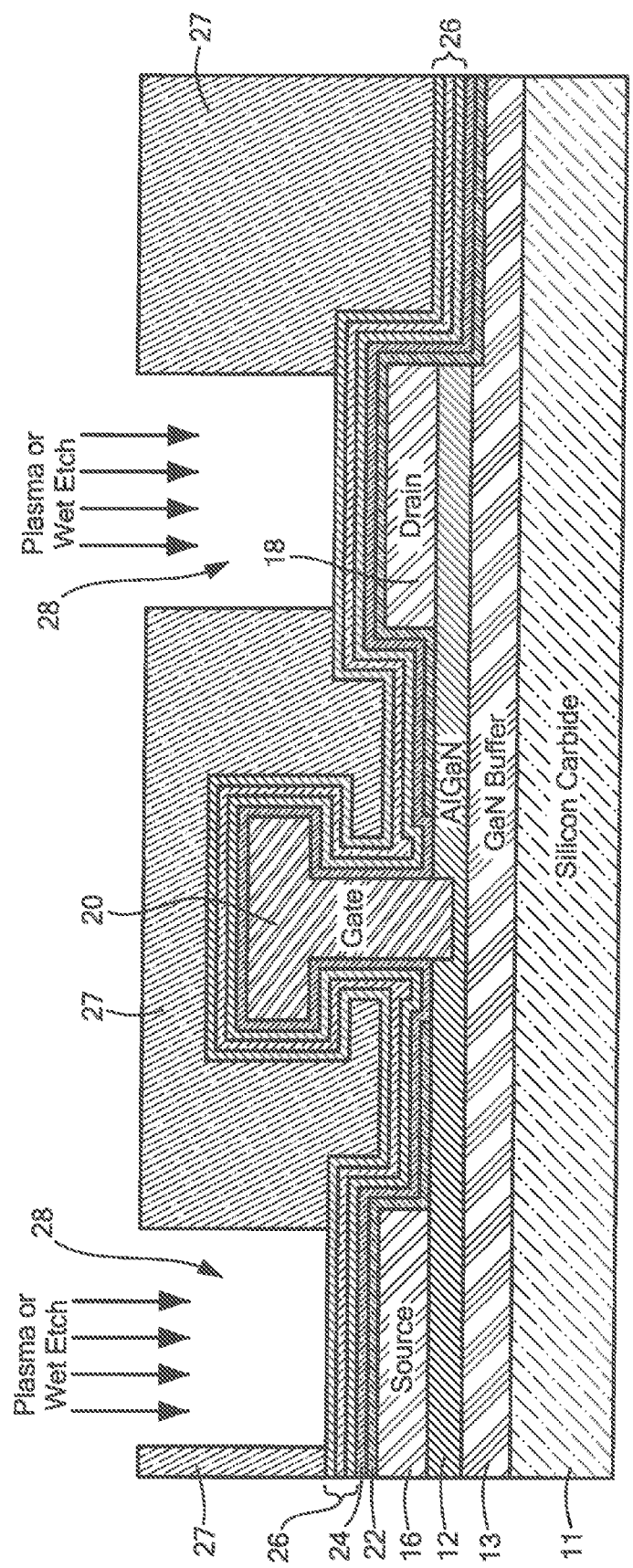
FIGS. 1A-1N are simplified, cross sectional diagrams of an MMIC at various steps in the fabrication thereof in accordance with the disclosure.
FIG. 1C' is an exploded view of a portion of an etch stop layer structure according to the disclosure used in the MMIC fabricated in accordance with FIGS. 1A-1N.

Referring now to FIG. 1A, a semiconductor structure 10 is shown having a substrate 11, here for example silicon carbide with a GaN semiconductor layer 13 thereon and a additional semiconductor layer 12 on semiconductor layer 13, layer 12 is here for example, a III-V semiconductor layer such as for example, here AlGaN. It should be understood that other semiconductors such GaAs, InP, for example, may be used on the suitable substrate. The semiconductor layer 12 has a transistor device, 14, here for example a field effect transistor (FET) device formed therein using any conventional processing to provide source and drain electrodes 16, 18, respectively as shown, in ohmic contact with the semiconductor layer 12 and a T-shaped gate electrode 20 in Schottky contact with the semiconductor layer 12 and a passivation layer 22, here disposed over the source and drain electrodes 16 and 18, and a portion of the semiconductor 12 as shown. Here for example the passivation layer 22 is silicon nitride. The gate electrode 20 controls the flow of carriers in the semiconductors layers 12, 13 between the source and drain electrodes. It is noted that the silicon nitride layer 22 is spaced from the bottom portion of the vertical sides of the T-shaped gate 20.

Next, referring to FIG. 1B, an additional layer 24 of silicon nitride is uniformly deposited over the entire structure shown in FIG. 1A, including the space in the layer 22 so that the additional layer abuts the bottom portion of the vertical sides of the T-shaped gate 20. Here, for example, the layer 24 is a 200 Angstrom thick layer of PECVD silicon nitride to provide gate 20 passivation.

Next, referring to FIG. IC, an etch stop layer structure 26 is uniformly disposed by Atomic Layer Deposition (ALD) on the passivation layer 24. Here, the etch stop layer structure 26 is a composite layer having: a first etch stop layer 26a of here for example, aluminum oxide, on the passivation layer 24, a buffer layer 26b of here for example silicon dioxide on the first etch stop layer 26a, and a second etch stop layer 26c of here for example aluminum oxide on the buffer layer 26b, as shown in FIG. 1C'. With such an arrangement, chemicals used in the photolithographic processing, to be described, while effecting the second etch stop layer 26c are prevented from effecting the first etch stop layer 26a by the buffer layer 26b. Here, the first and second etch stop layers 26a and 26c are here for example, each 25 Angstrom thin layer of Atomic Layer Deposited (ALD) layer of aluminum oxide and layer 26b is here for example, silicon dioxide having a thickness of, for example 10 Angstroms to 50 Angstroms.

Figure 1E:
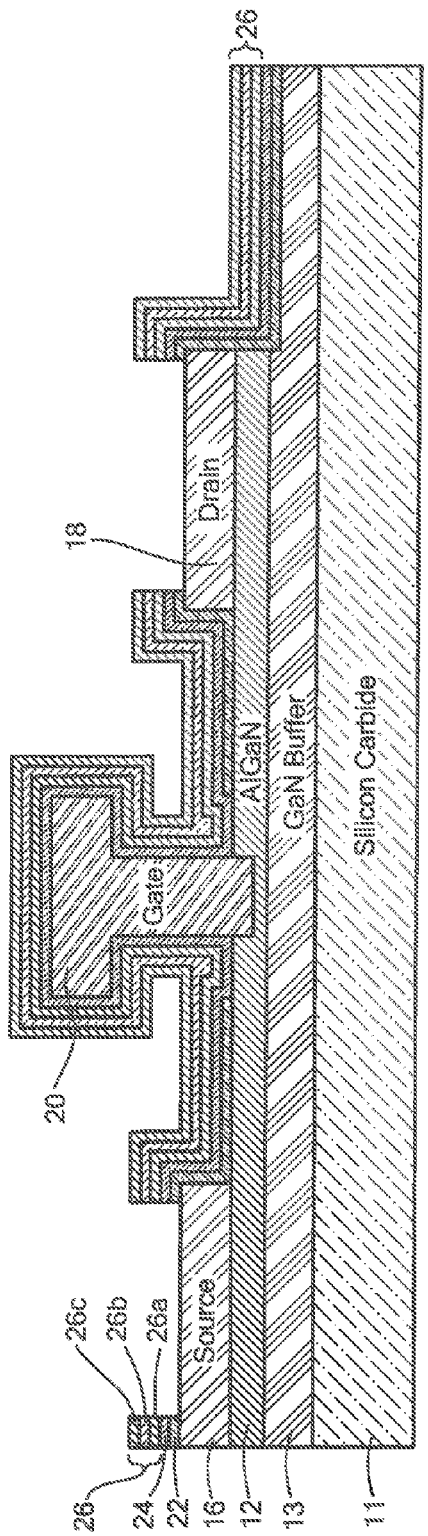

Next, referring to FIG. 1D, first level active device metallization processing begins by first forming a layer 27 of photoresist patterned as shown to have formed there-through windows 28 to expose portions of the etch-stop layer structure 26 and passivation layers 22 and 24 over the source and drain electrodes 16, 18 while covering the other portions of the etch-stop layer 26 including the portion of the etch-stop layer 26 over the gate electrode 20, as shown. It is noted that the gate electrode 20 terminates in a conductive gate pad, not shown, (out of the plane shown in FIG. 1D) and this conductive gate pad is also exposed by the windows 28 in the photoresist layer 27. The structure with the windowed photoresist layer 27, as shown, is subjected to a dry, for example, plasma, or wet etch, to remove, in a first step, portions of the etch-stop layer 26 exposed by the windows 28 and then, in a second step, as shown in FIG. 1E, remove the portions of the underlying silicon nitride passivation layers 24 and 22 thereby exposing the source and drain electrodes 16 and 18 as well as the not shown, out of plane gate contact pad. The photoresist layer 27 (FIG. 1D) is then stripped using any conventional removal technique, thereby leaving the structure shown in FIG. 1E.

Figure 1F:
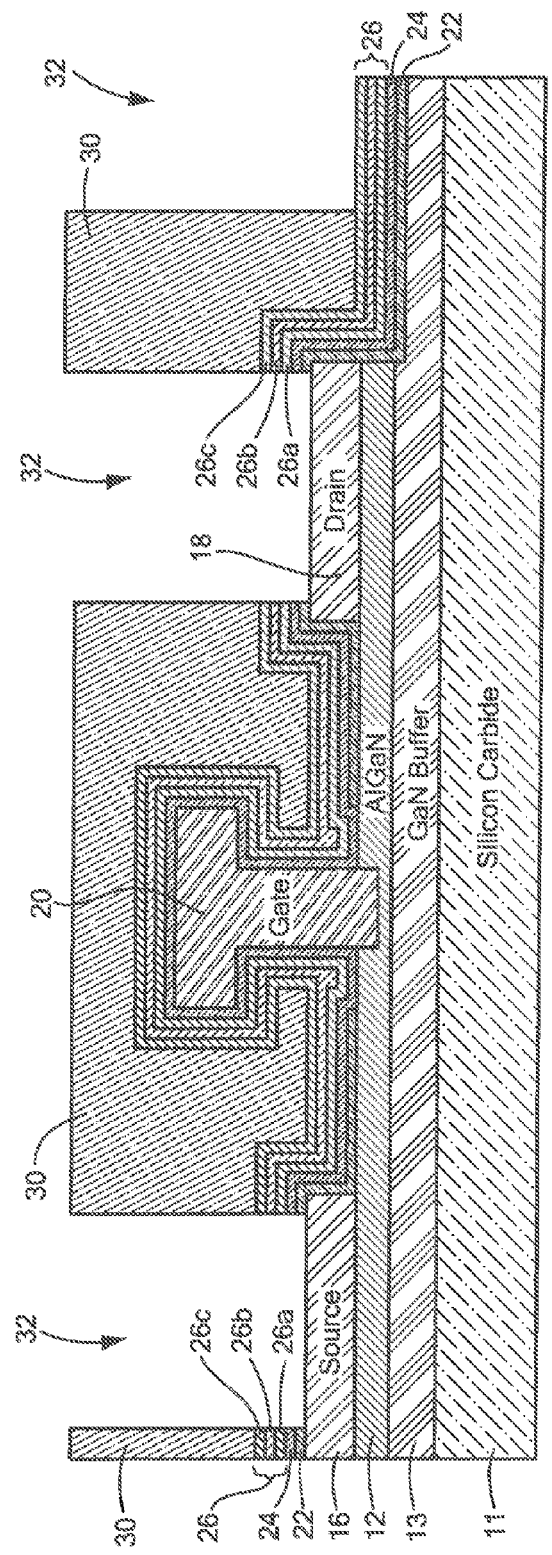

Next, referring to FIG. 1F, a photoresist layer 30 is deposited and lithographically processed to have windows 32 formed therein to expose regions where a first level (level 1) metallization is to be formed. This level 1 metallization will be used to form interconnects for the source and drain electrodes 16, 18, the gate contact pad (not shown and referred to above) as well as bottom electrodes for capacitors, to be described, and microwave transmission lines and coplanar ground plane structures of the MMIC to be formed.

Figure 1G:
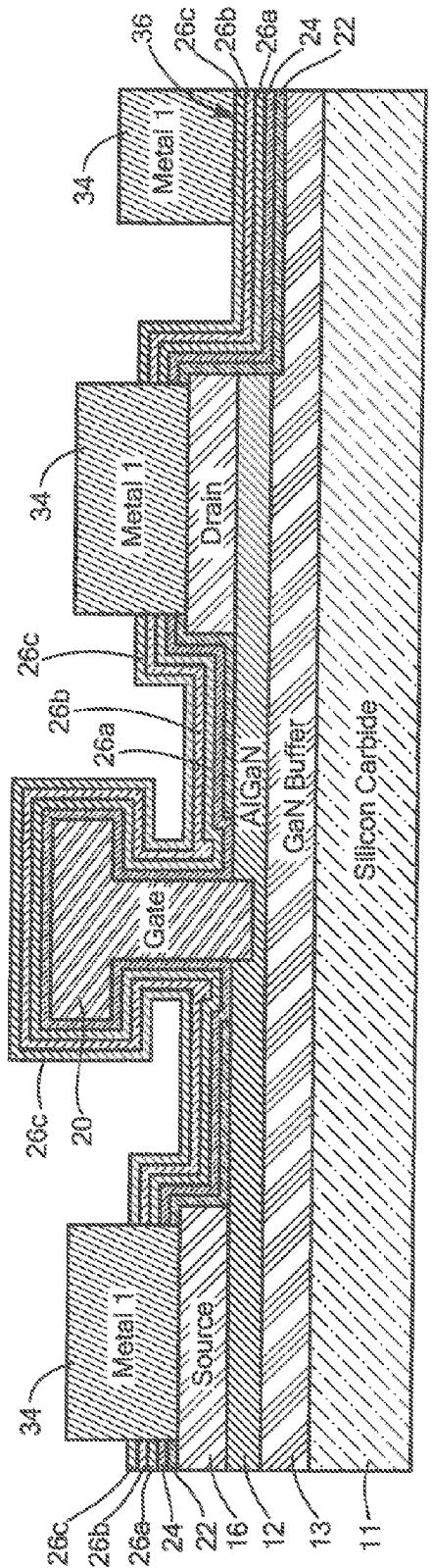
Figure 1H:
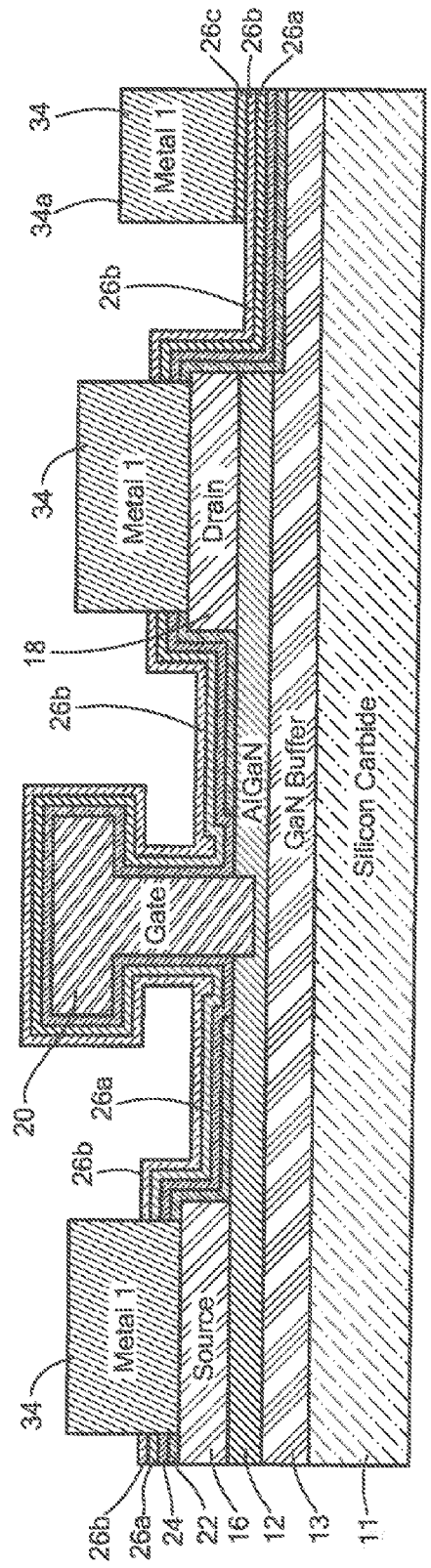

Referring now also to FIG. 1G, metal 34, here for example, a stack of titanium/platinum/gold is deposited on the photoresist layer 30 (FIG. 1F) and through the windows 32 therein onto the aforementioned exposed source and drain electrodes 16, 18, on the aforementioned gate contact pad (not shown) as well as other portions here for example a portion 36 of the etch stop layer 26 where a capacitor is to be formed. The photoresist layer 30 (FIG. 1F) is then stripped from the surface along with any metal 34 on top of layer 30 using any conventional removal technique, here including an ammonia wash, thereby resulting in the metal 34 thereon being lifted off the structure resulting in the structure shown in FIG. 1G.

Figure 11:
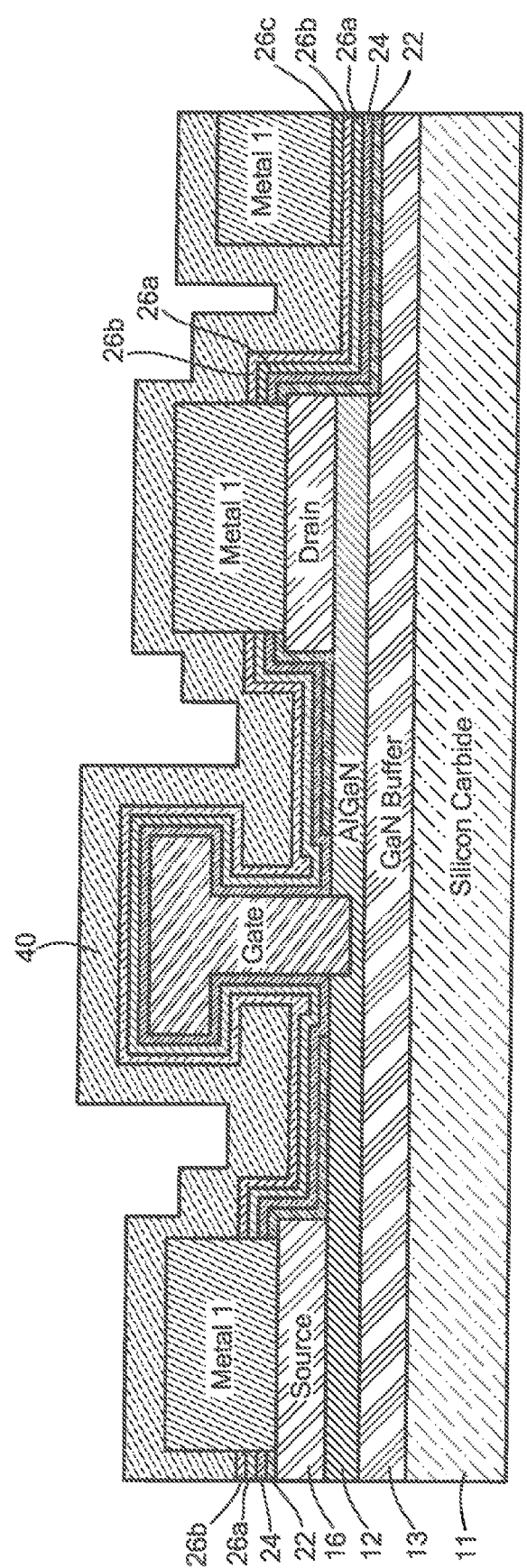

Next, exposed portions of the second etch stop layer 26c of ALD aluminum oxide layer are removed to clean the top surface of the wafer prior to depositing a PECVD silicon nitride layer 40 (FIG. 11). More particularly, prior to depositing the PECVD silicon nitride layer 40, a solvent pro-clean process is used to prepare the wafer surface for the PECVD silicon nitride layer 40. Such pro-cleans use chemical agents such as trichloroethylene, acetone, isopropanol, methanol, ammonia, etc. During the pro-clean procedure, the top-most aluminum oxide 26c is attacked and is therefore compromised in its ability to act as a good etch stop layer in subsequent processing. However, the silicon dioxide layer 26b acts to protect the bottommost aluminum oxide layer 26c, allowing for good gate and gate channel protection during the etch to be described in connection with FIG. 1J. It is also noted that the portions of the second etch stop layer 26c under the metal layer section 34a of metal layer 34 where the bottom plate of a capacitor is to be formed in a manner to be described, remains as it is protected by the metal layer section 34a.

Figure 1J:
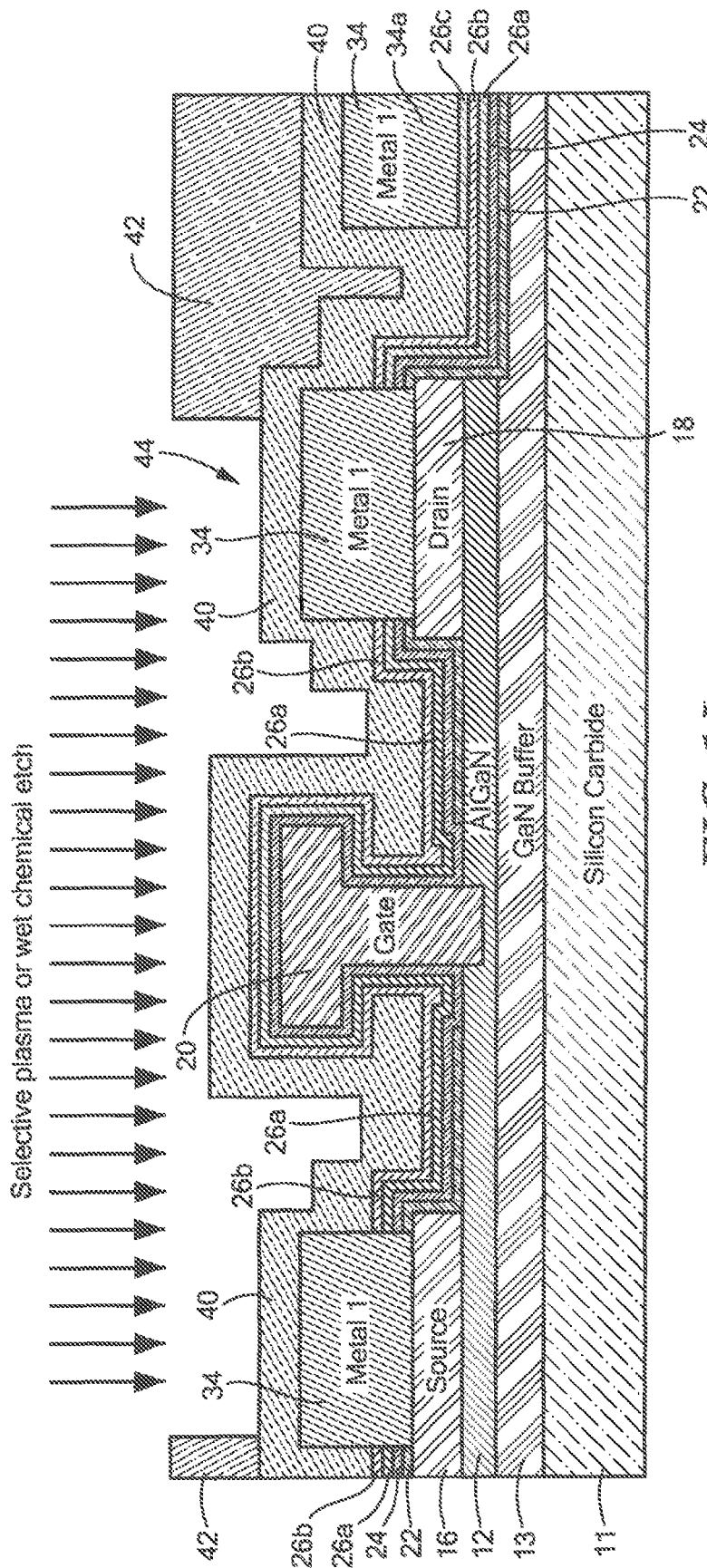
Figure 1K:
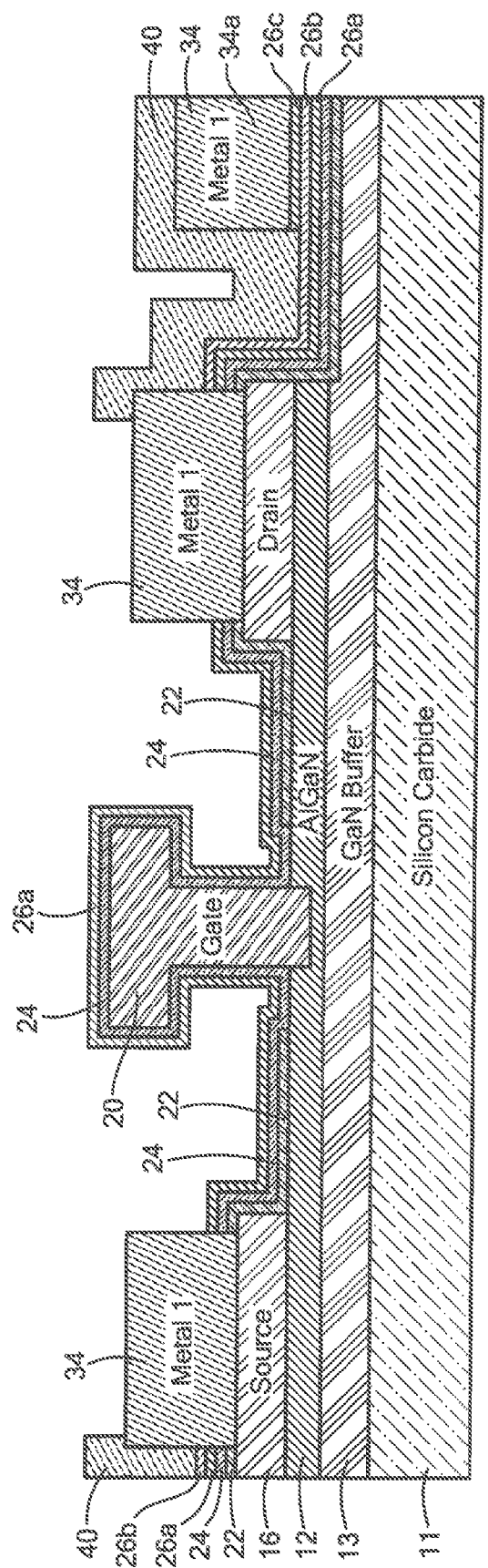

Next, a photoresist layer 42 is deposited and photolithographically processed to have a window 44 formed therein, as shown in FIG. 1J, with the photoresist layer 42 remaining over the portions of metal 34 being used, as mentioned above, to provide a bottom plate 34a for a capacitor to be formed. The structure is exposed to a dry etch, such as for example, a plasma etch such as reactive ion etching (RIB) or inductively coupled plasma etching (ICP), using sulfur hexafluoride based plasma etchants, or a wet etch. It is noted that the etch process etches away the exposed portions of the silicon nitride layer 40 at a rate significantly greater than that to the underlying portions of the aluminum oxide layer 26a, here for example 100 times greater, thus the aluminum oxide layer 26a is considered an etch stop layer since the etching stops at the aluminum oxide layer 26a, as indicated in FIG. 1K after removal of the photoresist layer 42. It is noted that the same etch step that removes the exposed portions of the thick silicon nitride layer 40 also removes underlying portions of the silicon dioxide layer 26b but the process still leaves the aluminum oxide layer 26a, as shown in FIG. 1K. (It is noted that the metal 34 disposed on the source and drain electrodes 16, 18 as well as the metal 34 disposed on the out of plane gate conductor pad (not shown) refered to above exposed by the window also acts as an etch stop).

Figure 1L:
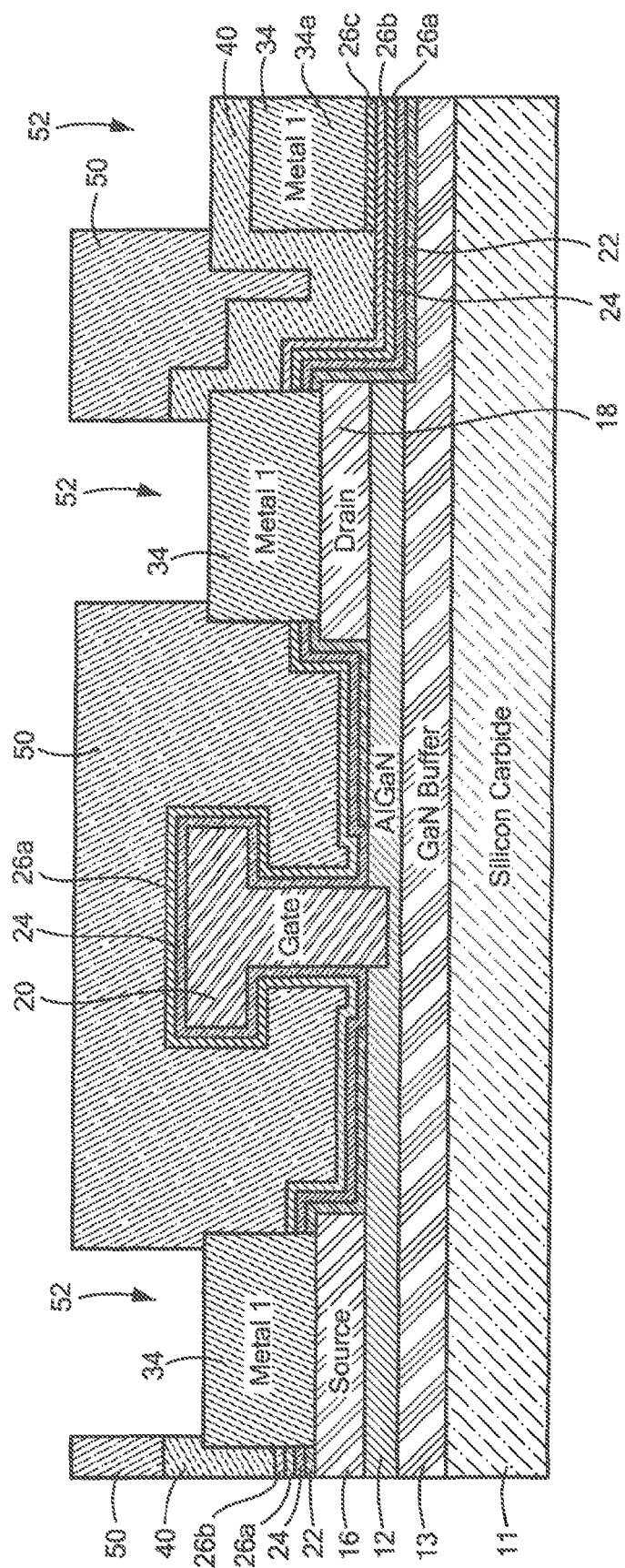
Figure 1M:
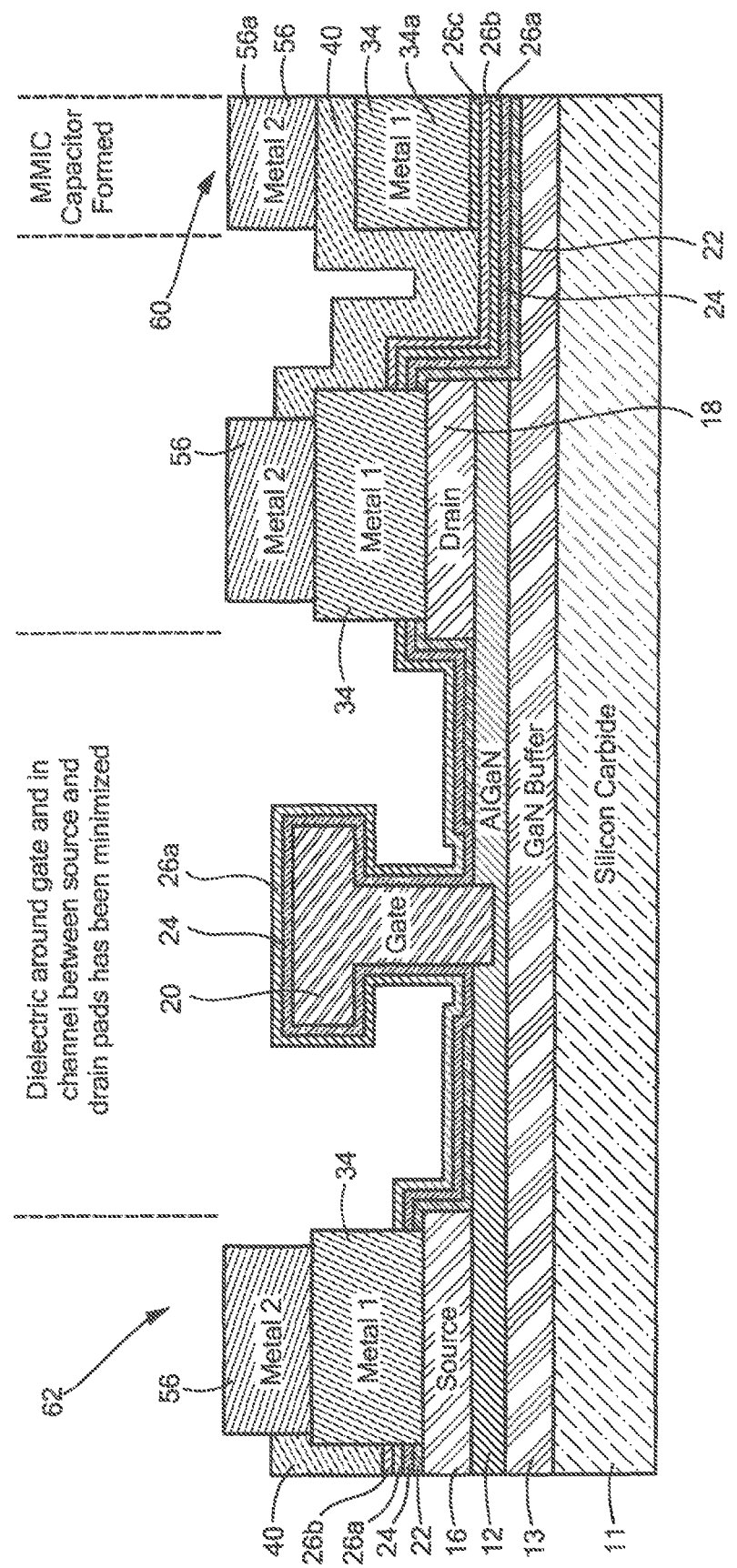

Next, the second level (level 2) metallization process begins by depositing a photoresist layer 50 and pattering the photoresist layer 50 lithographically to have windows 52 formed there-through, as shown in FIG. 1L. The windows 52 expose the metal 34 used for the source and drain electrode 16, 18, the gate conductor pad (not shown and described above) and the portion of the silicon nitride dielectric layer 40 over the bottom metal plate 34a to be used as the dielectric for the capacitor being formed. Next metal 56, here, for example, a stack of titanium/platinum/gold is deposited on the remaining portions of the photoresist layer 50 and on the metal 34 used on the source and drain electrodes 16, 18, the gate conductor pad (not shown and described above) and the portion of the silicon nitride dielectric layer 40 to be used for the capacitor being formed. Next, the photoresist layer 50 (FIG. 1L) is stripped using any conventional removal technique, here including an ammonia wash with the portions of the metal 56 thereon being lifted off the structure while the remaining portions of the metal 56 remain on the first-level metal 34 disposed on source and drain electrode metal 16,18, the gate conductor pad (not shown and described above) and the portion of the silicon nitride dielectric disposed on first-level metal 34, thereby completing the formation of the capacitor 60, the upper plate being designated 56a of the MMIC 62 (FIG. 1M).

Figure 1N:
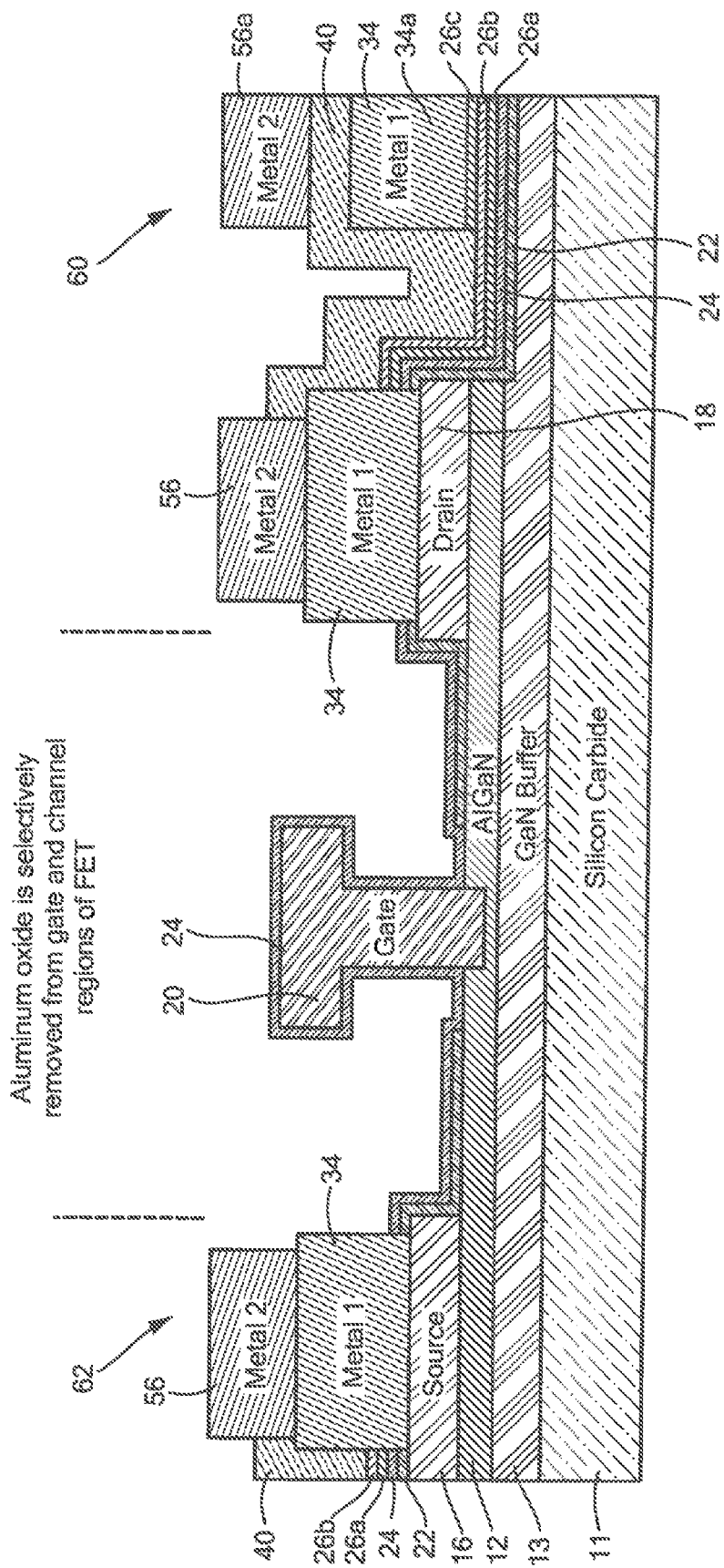

Next, the aluminum oxide layer 26a is removed from regions unprotected by metal 34 or silicon nitride layer 40, as shown in FIG. 1N, using dilute ammonia. This eliminates the presence of the etch stop layer in the active regions of the MMIC, specifically in the entire region between source and drain contacts, with includes the surface above the transistor channel regions and around the entire gate electrode.

Figure 2A:
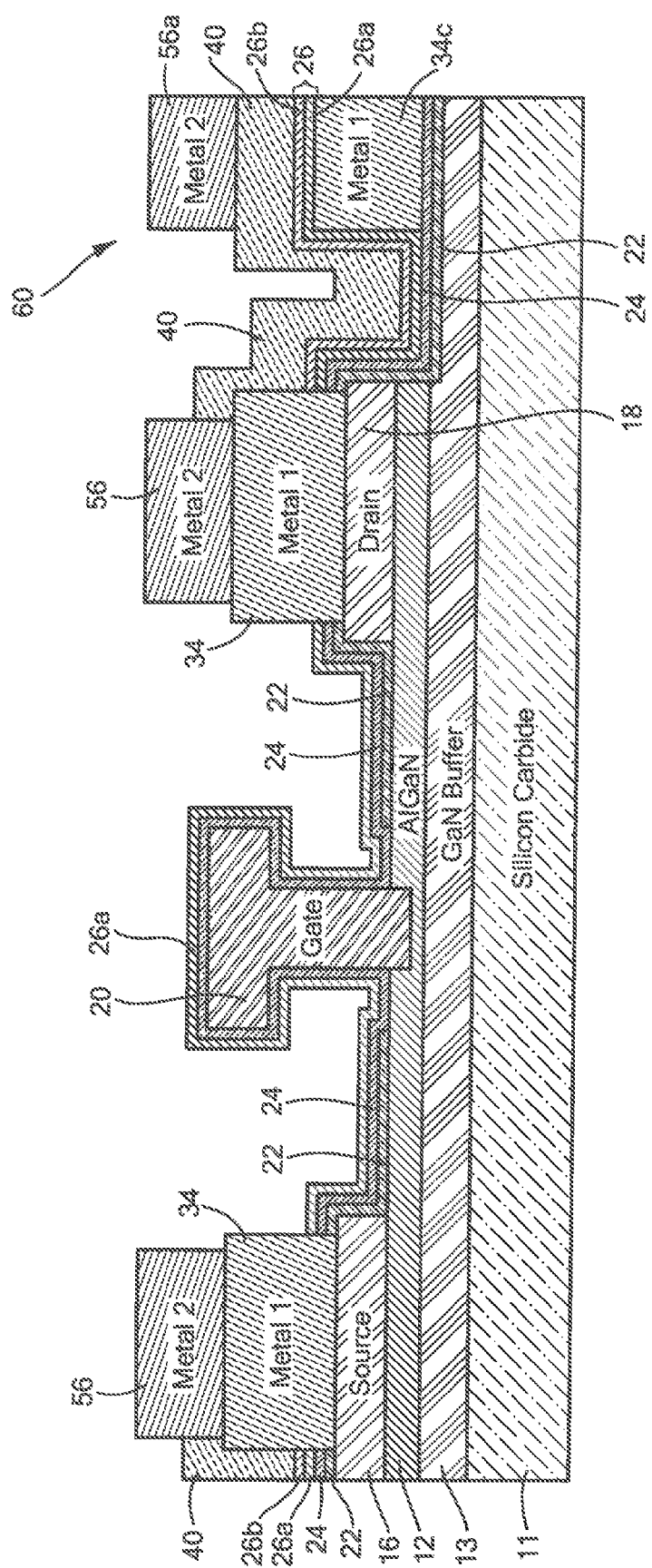
FIGS. 2A and 2B are simplified, cross sectional diagrams of an MMIC at various steps in the fabrication thereof in accordance with an alternate embodiment of the disclosure.
Figure 2B:
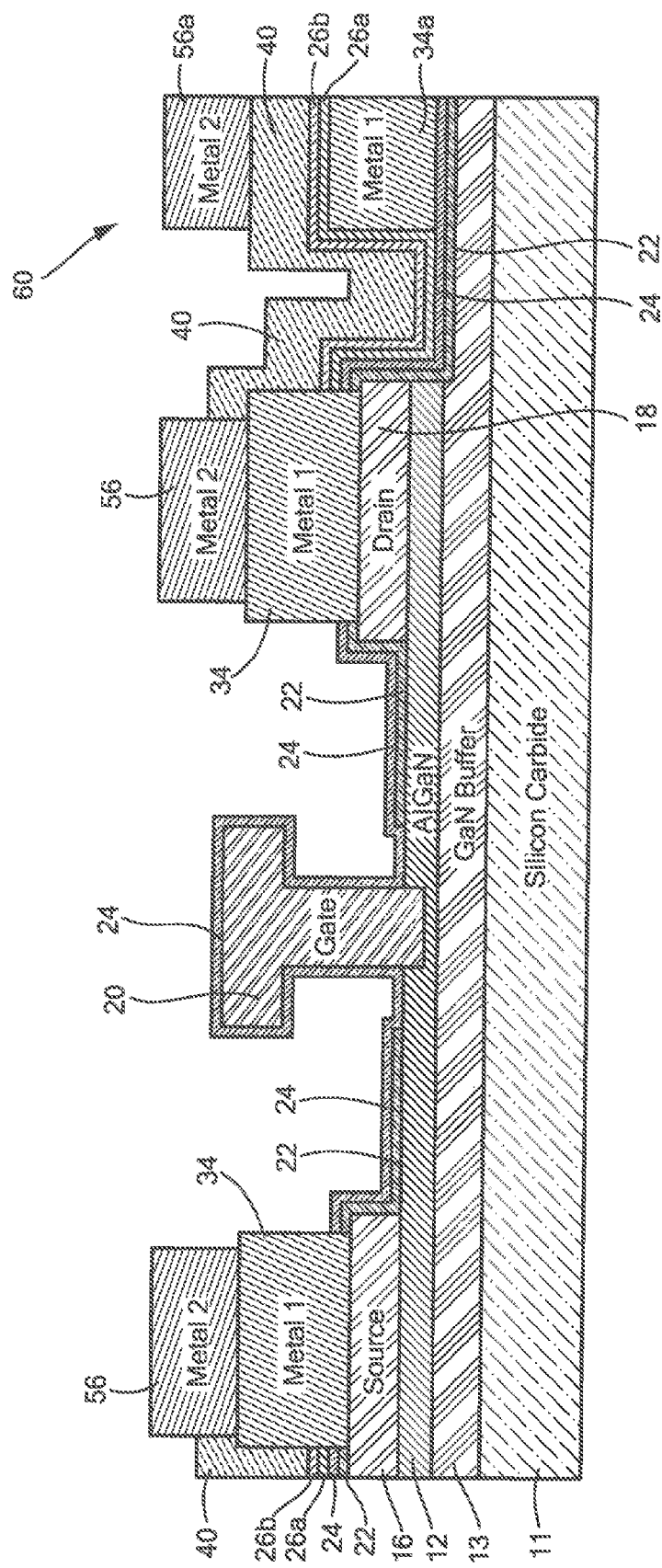

It should be noted that the process described above may be modified so that the composite etch stop layer, shown in FIG. 1C', may be formed after the structure shown in FIG. 1G is formed rather than after the structure shown in FIG. 1B is formed. In such case, structure after performing the process described above in connection with FIGS. 1H-1M, the modified process would result in the structure shown in FIG. 2A. The process described above in connection with FIG. 1N would therefore result in the structure shown in FIG. 2B.

A number of embodiments of the disclosure have been described. Nevertheless, it will be understood that various modifications may be made without departing from the spirit and scope of the disclosure. For example, the method may be used with bipolar transistors. Accordingly, other embodiments are within the scope of the following claims.

What is claimed is:

1. A semiconductor structure comprising;
   a III-V semiconductor layer;
   source and drain electrodes in ohmic contact with the semiconductor layer;
   a gate electrode in Schottky contact with the semiconductor layer;
   a passivation layer disposed over the source, drain and gate electrodes,
   an etch stop layer disposed on the passivation layer, the etch stop layer comprising: a first etch stop layer on the passivation layer, a buffer layer on the first etch stop layer, and a second etch stop layer on the buffer layer;
   a dielectric layer disposed on a first portion of the etch stop layer, the dielectric layer having a window therein, such window exposing a second portion of the etch stop layer.

2. The semiconductor structure recited in claim 1 wherein the etch stop layer is disposed over portions of the source and drain electrodes.

* * * * *